United States Patent
Chatterjee et al.

[11] Patent Number: 5,822,241
[45] Date of Patent: Oct. 13, 1998

[54] DRAM PASS TRANSISTORS

[75] Inventors: Amitava Chatterjee; Purnendu K. Mozumder, both of Plano, Tex.

[73] Assignee: Texas Instruments Incorporated, Dallas, Tex.

[21] Appl. No.: 901,853

[22] Filed: Jul. 29, 1997

Related U.S. Application Data

[60] Provisional application No. 60/022,378 Jul. 29, 1996.
[51] Int. Cl.⁶ .................................................. G11C 11/401
[52] U.S. Cl. .......................... 365/149; 365/182; 257/327
[58] Field of Search ..................................... 365/149, 182, 365/189.09; 257/327, 901, 347

[56] References Cited

U.S. PATENT DOCUMENTS

| | | | |
|---|---|---|---|
| 5,274,586 | 12/1993 | Matsukawa | 365/149 |
| 5,309,386 | 5/1994 | Yutsuki et al. | 365/149 |
| 5,323,343 | 6/1994 | Ogoh et al. | 365/149 |

*Primary Examiner*—Vu A. Le
*Attorney, Agent, or Firm*—Carlton H. Hoel; W. James Brady; Richard L. Donaldson

[57] ABSTRACT

A pass transistor for a 1-transistor dynammic random access memory (DRAM) integrated circuit with a square root relation between threshold adjustment dose and substrate bias.

2 Claims, 6 Drawing Sheets ns of design parameters can be large and render the

DRAM PASS TRANSISTORS

This application claims benefit to USC Provisional Appln. No. 60/022,378 filed Jul. 29, 1996.

CROSS REFERENCE TO RELATED APPLICATIONS

The following U.S. patent applications disclose related subject matter: Ser. Nos. 08/358,647, filed Dec. 19, 1994 and 08/483,405, filed Jun. 7, 1995.

BACKGROUND OF THE INVENTION

The invention relates to electronic devices, and, more particularly, to dynamic radonw access memory (DRAM) integrated circuits.

Due to cost and access speed considerations, primary memory for digital computers typically includes dynamic random access memory (DRAM) in the form of silicon integrated ciruits. DRANs typically have an array of 1-bit capacity memory cells arranged into rows and columns; each cell has a storage capacitor with a bit stored indicated by the capacitor being charged or discharged. An insulated gate field effect pass transistor connects the storage capacitor with charge sensing and setting circuitry. FIG. 1 heuristically illustrates a DRAM architector. DRAMs with capacities of 16 megabits (Mb) (1 megabit is $(1024)^2$ bits) currently dominate the market with 64 Mb DRAMs making initial appearance.

Designers focussing on 256 Mb DRAM designs face problems such as devising pass transistors with small enough subthreshold leakage current so that the charge stored on the capacitor does not leak away too rapidly and with sufficiently large charge stored in the capacitor to make pracatical the sensing of the charge. For example, Chatterjee et al, A Pass Transistor Design Methodology for 256 Mbit DRAM and Beyond, VLSI Tech. Symp. (1994), shows with experimental inputs and design presumptions for a 2.5 volts power supply with a substrate bias of −1 volt that a 0.3 µm gate length transistor optimally has a 85 A gate oxide thickness and a channel doping concentration of $2.7 \times 10^{17}/cm^3$.

However, designs for other bias voltages and gate lengths are needed.

SUMMARY OF THE INVENTION

The present invention provides DRAM pass transistor designs by relating input design parameter values where the main source of variability in performance of the array device is its gate length, which is due to variability in the lithography and etching processes.

These designs have advantages including high yield manufacturability while maintaing device performance.

BRIEF DESCRIPTION OF THE DRAWINGS

The drawings are schematic for clarity.

DESCRIPTION OF THE PREFERRED EMBODIMENTS

Overview

Figure 1A:
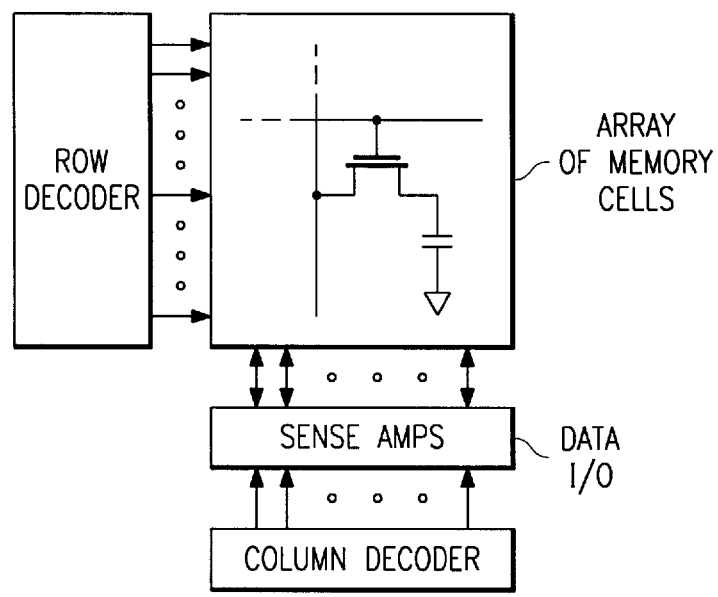
FIGS. 1a–b show a DRAM layout and a single memory cell.
Figure 1B:
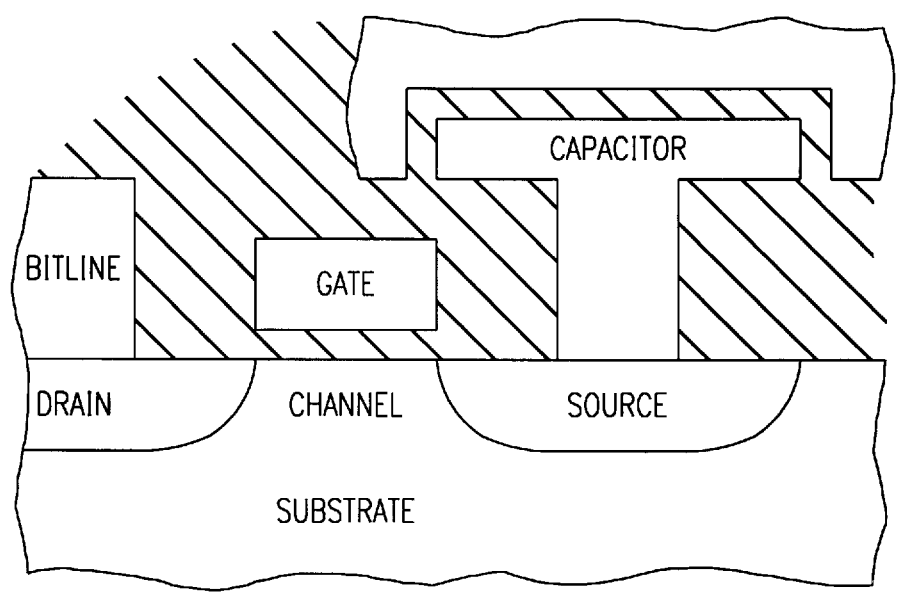
Figure 2:
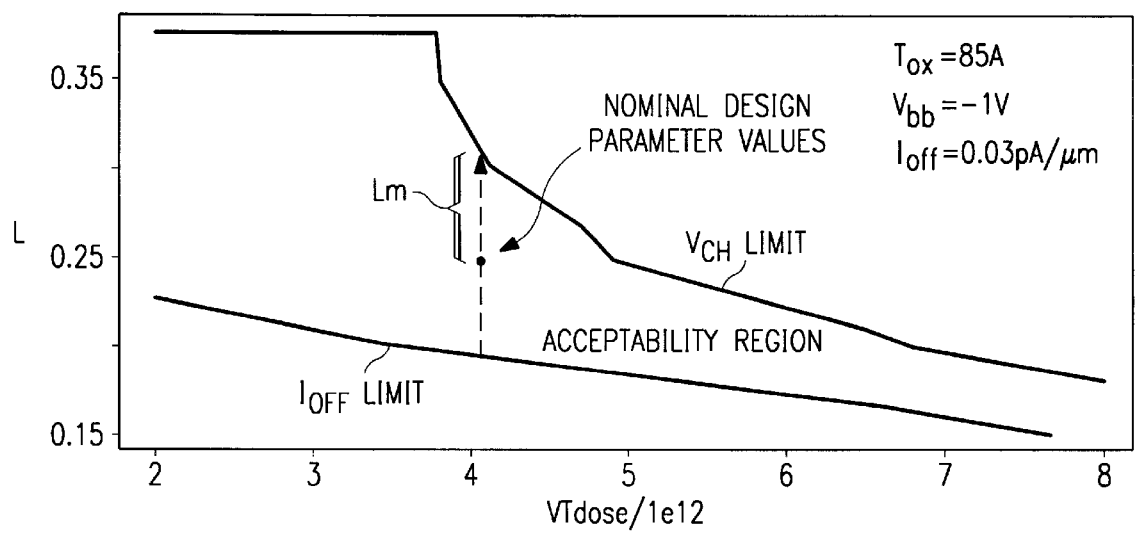
FIG. 2 illustrates an cross section of an acceptability region.

FIG. 1a schematically shows a DRAM with an array of 1-bit memory cells (a single enlarged cell is shown) and peripheral circuitry, and FIG. 1b shows a single memory cell with MOSFET pass transistor and storage capacitor. Two pass transistor specifications (subthreshold leakage current $I_{OFF}$ and threshold voltage during storage capacitor charging) dominate design problems and define regions of "acceptability" in a four-dimensional space of transistor design parameters: gate length, gate oxide thickness, substrate bias, and channel doping profile in terms of a threshold adjustment implant dose for a given substrate concentration. Experimental data and theoretical presumptions underlie the acceptability regions. In particular, FIG. 2 shows a two-dimensional cross section of an acceptability region with gate length and implant dose as variables for a given substrate bias and gate oxide thickness.

Cross sections of the region of acceptability provides the design parameters for particular transistors.

Methodology

The preferred embodiments discover unexpectedly narrow ranges of pass transistor fabrication parameters to create manufacturable DRAMs. Several performance characteristics have to be constrained during the pass transistor design. One of the primary performance constraints for the DRAM cell is in terms of the cell leakage. The cell leakage comprises three parts: the subthreshold leakage ($I_{OFF}$), the gate induced drain leakage (GIDL), and diode leakage. As the gate length is scaled aggressively the lmiting mechanism is $I_{OFF}$. Thus the design goal is to keep $I_{OFF}$ below an acceptable value. Similarly, a second design goal is that the voltage to which the storage node (capacitor) is charged via the pass transistor must be at least a fraction, such as 80%, of the bitline voltage when the bitline is precharged to the power suppply voltage, Vcc.

Constraints have also been placed on the gate oxide reliability and integrity. The maximum value of the electric field in the gate oxide for under operating conditions is chosen from oxide reliability and yield considerations. The preferred embodiments have chosen the maximum electric field to be 4 MV/cm less than the experimentally derived 10-year lifetime for time dependent dielectric breakdown. The operating electric fields for the different oxide thicknesses considered are

| Gate oxide (A) | Operating electric filed (MV/cm |
|---|---|
| 77 | 4.46 |
| 85 | 4.45 |
| 96 | 4.13 |
| 103 | 3.93 |

In addition to the constraint imposed by maximum electric field, the maximum booted wordline voltage has a practical limit depending upon the capabilities of the bootstrap circuit. The preferred embodiments have presumed a limit of 1.5×Vcc=3.75 volts for the presumed 2.5 volts power supply voltage. Nominal gate lengths of 0.3 and 0.25 µm are considered for 256 Mb and possibly 1 Gb DRAMs.

The manufacturability problem is one of relating input design parameter values to an output figure of merit for the designed device in terms of the performance characteristics and probabilities of generating unacceptable devices. The number of design parameters can be large and render the design problem intractable, so the preferred embodiments restrict consideration to four input design parameters: gate length (L), gate oxide thickness, threshold implant dose (VTdose), and back (substrate) bias voltage (Vbb). Gate length affects the DRAM pass transistor disgn primarily because of short-channel effects. Thin gate oxide could limit the maximum wordline voltage used to turn on the pass transistor and hence limit the stored charge. VTdose is the process parameter that mainly affects the flatband voltage of the pass transitor and thus threshold voltage. Vbb affects the pass transistor characteristics in two ways: it improves the subthreshold swing which is desiable for reducing $I_{OFF}$, and it degrades the short-channel effect which is undesirable since it results in more rapid incrase in $I_{OFF}$ as L is reduced.

The variable Vbb is discrete, and is constrained to assume the values of 0, −1, and −2 volts. Gate oxide thickness was experimentally limited to three values: 77 A, 85 A, and 96 A. VTdose was considered only in the range of $2.0–8.0\times10^{12}$ boron ions/cm$^2$ with an implant energy of 20 keV into a p-type silicon substrate with a doping concentration of about $1\times10^{15}$/cm$^3$. This range of implant doses will increase the doping concnetration in the top 100 nm of the substrate to roughly the range $2.0–8.0\times10^{17}$/cm$^3$. The designed transistor should have performance characteristics of $I_{OFF}$ of less than 0.03 pA/$\mu$m and $V_{CH}$ at least 0.8×Vcc.

With reference to FIG. 1$b$, consider writing a "1" into the memory cell. Assume that the storage capacitor is initially at 0 volt and the bitline voltage is 2.5 volts (Vcc). When the wordline voltage is booted to a high (3.75 volts or the maximum allowed by the gate oxide), the objective of the pass transistor is to charge the storage node to the bitline voltage of 2.5 volts. However, the stroage capacitor potential practically ceases to rise once the gate-to-source voltage becomes less than the threshold voltage of the pass transistor. In this case the gate-to-source voltage is the difference between the wordline voltage and the storage capacitor voltage, as illustrated in FIG. 1$b$. Note that this threshold voltage is higher than the nominal threshold voltage because the stroage capacitor voltage is effectively an additional back bias to the pass transistor. In other words, $V_{CH}=Vw1-VTsp$ where Vw1 is the wordline voltage and VTsp is the threshold voltage corresponding to a high (Vcc) source potential. Thus VTsp is the threshold voltage at a fixed back bias of Vbb-Vcc. Hence, the constant on $V_{CH}$ derives from a single experimental measurement of VTsp.

Experimental transistors using a 2.5 volts power supply were measured to obtain $I_{OFF}$ and VTsp as functions of the four input design parameters (gate length, gate oxide thickness, VTdose, and Vbb) for various values of the input design parameters. Simulations filled in and extrapolated the experimental results. The experimental transistors were n-channel MOSFETs on 10–15 ohm-cm p-type (100) silicon, the transistors had an arsenic lightly doped drain (implant dose $4\times10^{13}$/cm$^2$) without additional source/drain implants, the arsenic implant had a 20 minute anneal at 900° C.

The problem of design of a DRAM pass transistor for manufacturability amounts to determiining the input design parameter values (L, VTdose, gate oxide thickness, Vbb) that would minimize the probability of failure of any pass transistor of the DRAM to satisfy the performance characteristics limitations ($I_{OFF}$ nad VTsp bounds) for given variabilities of the design parameter values. Each input design parameter presumptively has a variability about its nominal (designed) value, so the four-dimensional input design parameter space has a joint probability density (defined by the four input design parameters as random variables) which represents the distribution of actual pass transistor parameter values. The points of the four-dimensional space which define pass transistors satisfying the performance characteristic limitations ($I_{OFF}$ and VTsp) define the acceptability region, and thus the integration of the joint probability density over the acceptability region gives the probability of an accepaable pass transistor being manufactured for the designed nominal input design parameter values.

The acceptability region was determined by first fabricating a set of pass transistors for certain input design parameter values and measuring $I_{OFF}$ and VTsp). Then use response surface madels to interpolate and extrapolate to other input parameter values. FIG. 2 illustrates a two dimensional cross section defined the gate oxide thickness equal to 85 A and Vbb equal to −1 volt. The upper boundary in FIG. 2 corresponds to the $V_{CH}$ performance limitation and the lower boundary corresponds to the $I_{OFF}$ performance limitation.

For a 256 Mb DRAM to meet specifiations, all $2^{28}$ pass transistors must meet the prescribed performance characteristics. This, in turn, means that the probability of parametric failure for the DRAM must be very small. Therefore the errors in estimating the yield must be very small. This implies intolerably large computations for a direct estimation of joint probability density.

Among the input design parameters for the 256 Mb DRAM pass transistor, the preferred embodiments choose the gate length L as the dominant parameter for statistical variations in the output performance characteristics because the advantages of cost and performance always drive the technology towards the shortest possible target for L which is also the regime where VTsp and $I_{OFF}$ are most sensitive to variations in L; recall FIG. 2. Shorter gate length has the advantages of higher performance as well as higher packing denisty which in turn leads to a lower cost per die. Thus, in a DRAM, where a large part of the circuit is the memory array, the target gate length of the array pass transistor is pushed to the limit of the patterning capability. The penalty is increased vulnerability to gate length variations. In a methodlogy whre the transistor is optimized for maximum performance, the design may result in poor manufacturability because there is likely to be little margin for gate length variations. Thus, the preferred embodiemnts position the other input design variables to maximize the allowable margin for gate length variations while satifying the performance characteristic limitations. Thus the preferred embodiments define Lm for a given set of nominal input design parameter values as the distance in the L direction to the nearest boundary of the acceptability region. An Lm is indicated for the acceptability region illustrated in FIG. 2. From the one-dimensional viewpoint it can be said that the larger the Lm the less is the design susceptibleto fluctuations in L and hence the higher is the resulting yield.

To insure that all $2^{28}$ pass transistors in a 256 Mb DRAM are within specifications Lm should be at least 0.08 $\mu$m which is 5 times a presumed L standard deviation of 0.016 $\mu$m.

Five standard deviations was chosen for an expected value of yield greater than 99%. Three standard deviations would give a 99% probability that a particular single pass transistor would work, and all $2^{28}$ pass transistors are not independent, so an additional two standard deviations were added to compensate for across die variations. The following sections show the resultant designs.

Target Gate Length 0.3 $\mu$m

The first preferred embodiment pass transistors have a target gate length of 0.3 $\mu$m. The acceptability region for $I_{OFF}$ of less than 0.3 pA/μm and $V_{CH}$ of at least 0.8 $V_{DD}$ yields the Lm and VTdose relation shown in FIGS. 3a–c for substrate biases of 0, −1, and −2 volts, respectively. Each Figure shows the Lm-VTdose relation for three gate oxide thickenesses: 77, 85, and 96 A. Because VTdose can be fairly accurately controlled, the variability of lithographically defined gate length dominates the variability and thus the preferred embodiments take the maximum Lm to define the pass transistor input design parameters values. Indeed, from FIGS. 3a–c the designs appear to all have approximately the same Lm in the 77–85 A range. The following table gives the VTdose corresponding to the maximum Lm in units of $10^{12}$ dopants/cm$^2$:

| Vbb | 77 A | 85 A |
|---|---|---|
| 0 | 3.0 | 4.8 |
| −1 | 2.3 | 3.8 |
| −2 | 1.9 | 3.3 |

Thus VTdose relates to gate oxide thickness $T_{ox}$ in a first (linear) approximation in the range about 77–85 A as:

$$VTdose = -1.0 + (T_{ox} - 59)(0.225 - 0.04\sqrt{-Vbb})$$

Figure 3A:
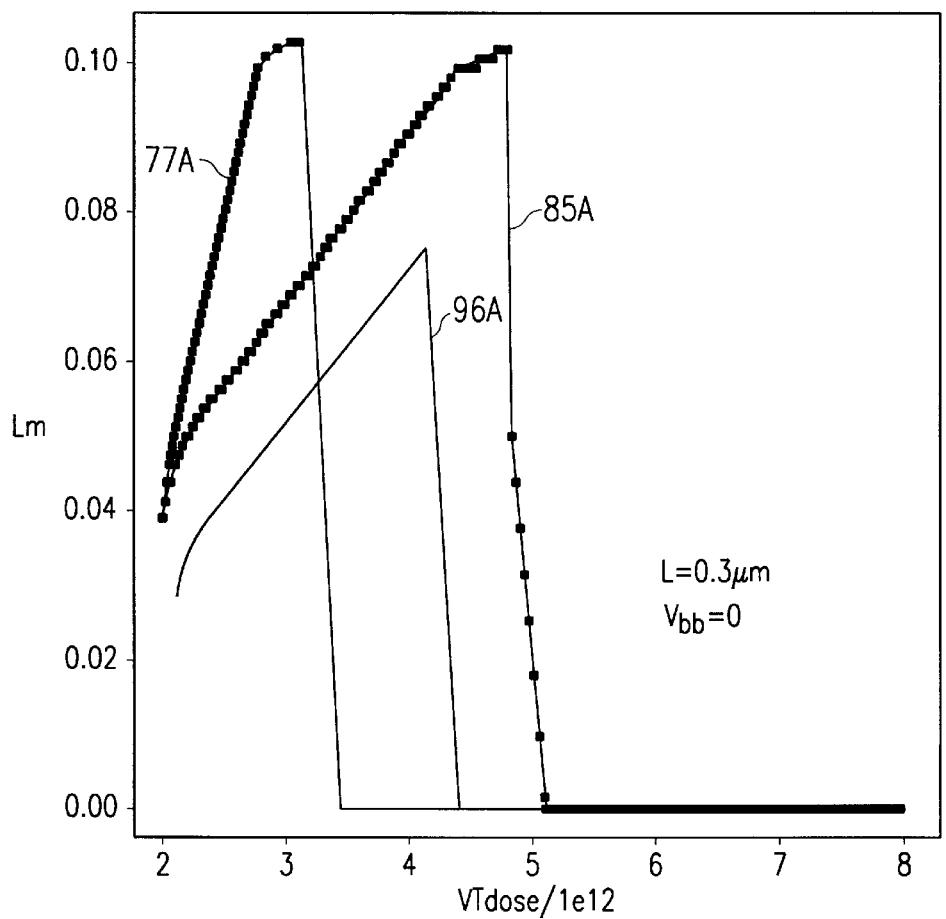
FIGS. 3a–c show a first preferred embodiment design.
Figure 3B:
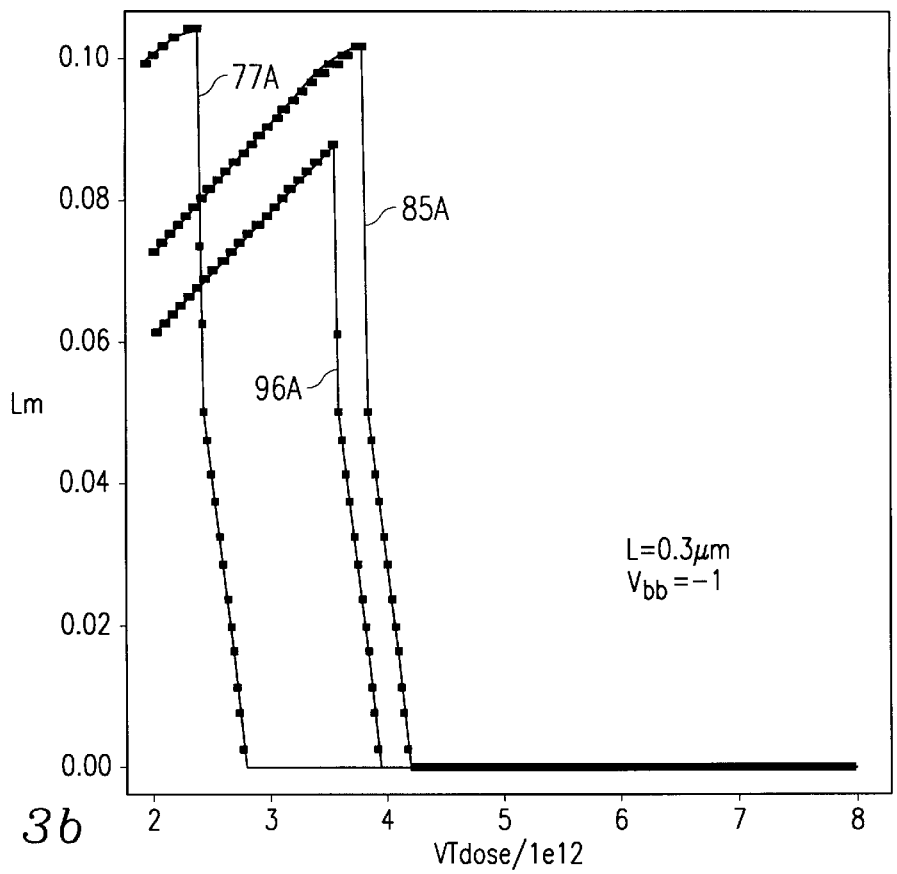
Figure 3C:
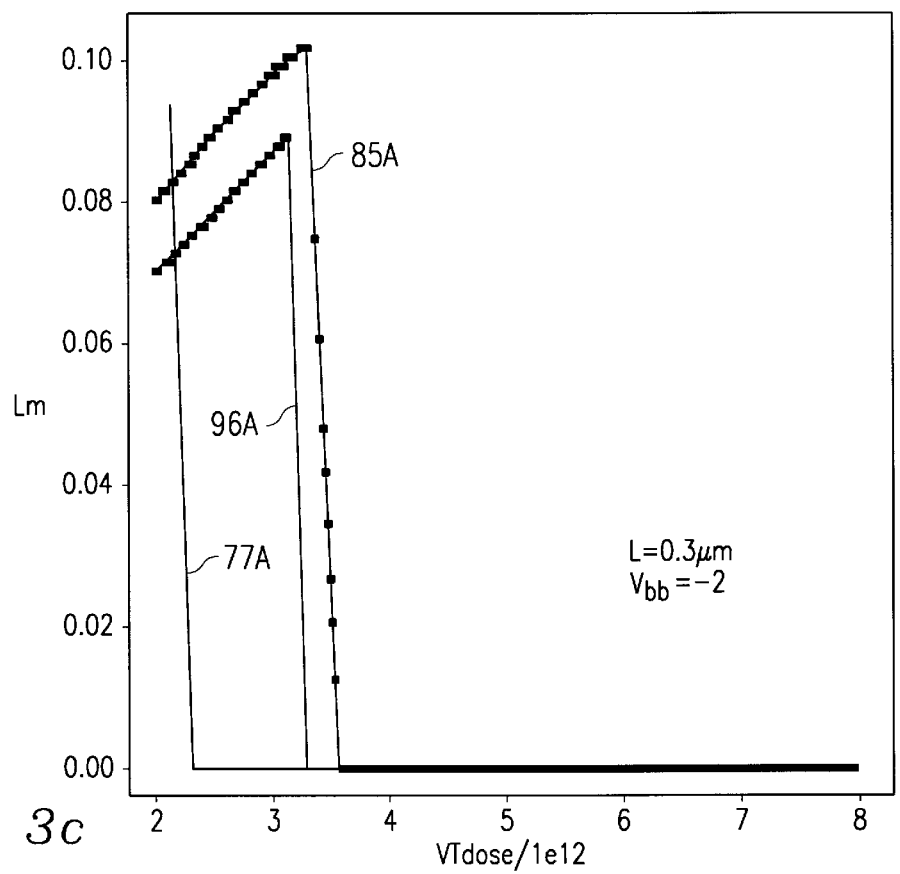

The Lm for these cases are all above 0.1, so the design could be made more robust in view of other considerations. In particular, FIGS. 3a–c illustrate the peakiness of the Lm-VTdose relation and that changes in gate oxide thickness require correspondingly larger changes in VTdose to maintain Lm at a maximum, and thus inaccuracy in gate oxide thickness could be a problem. Lowering the Lm requirement to 0.08 μm, rather than maximum, then allows compensation for target gate length inaccuracy by picking an 85 A gate oxide thickness which has a less steep slope in the Lm-VTdose relation and then center VTdose at Lm=0.08. This approach for Vbb=−1 appears in Chatterjee et al cited in the background which maximizes the VTdose window. The corresponding result for Vbb=0 is a VTdose equal to 4.2×10$^{12}$/cm$^2$.

Figure 4A:
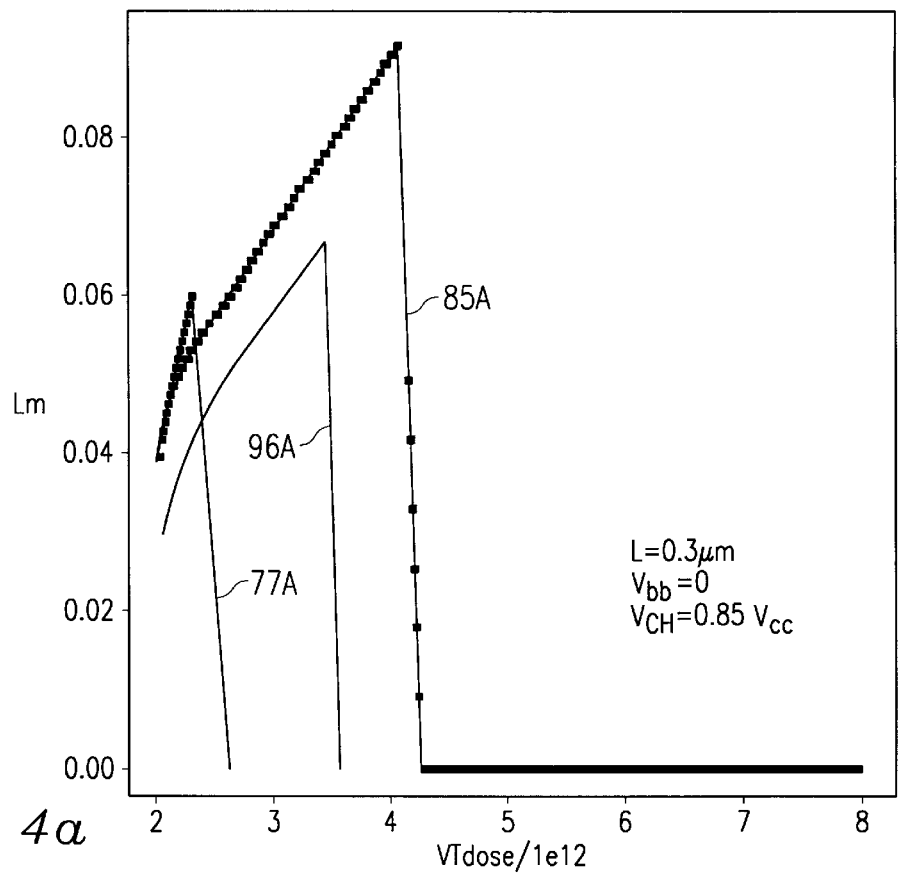
FIGS. 4a–c show a second preferred embodiment design.
Figure 4B:
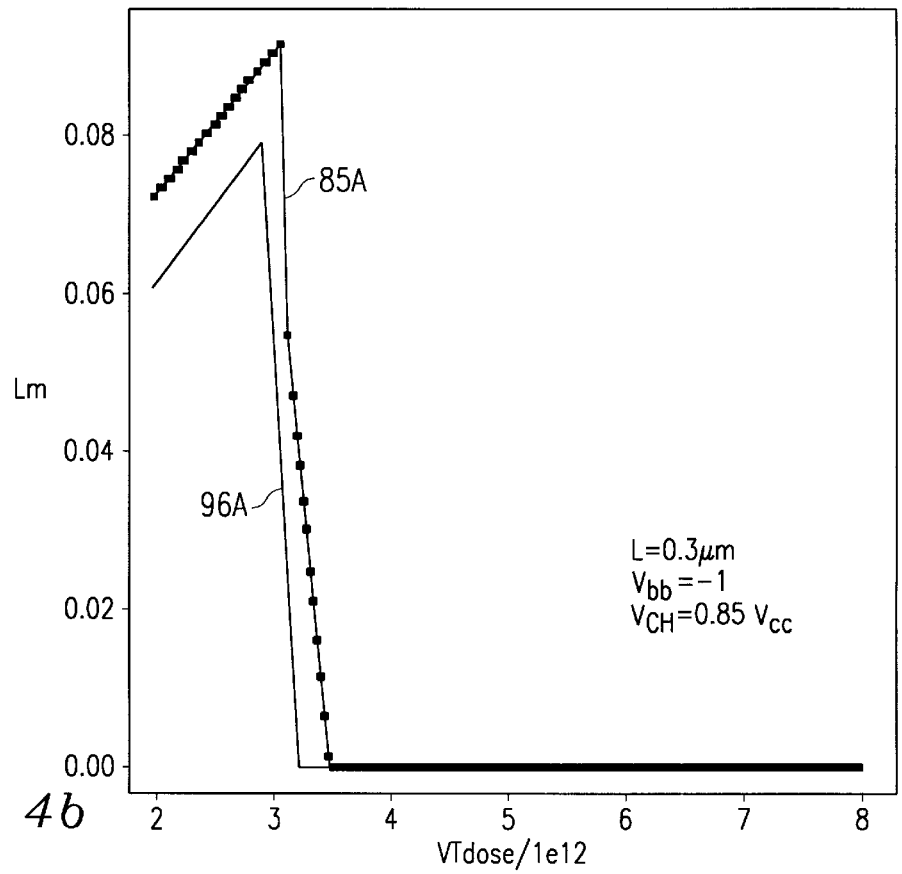
Figure 4C:
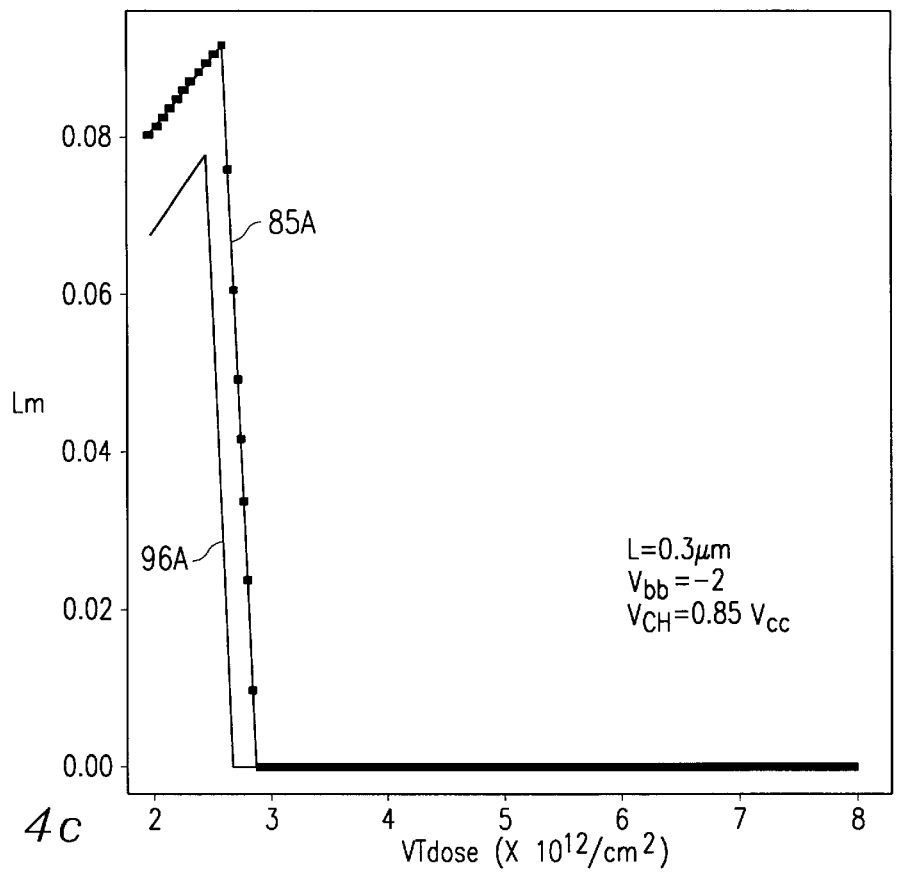

An alternative use of the large Lm is to increase $V_{CH}$. In particular, FIGS. 4a–c show the Lm-VTdose relation for $V_{CH}$=0.85 Vcc for Vbb=0, −1 and −2 volts; again each Figure shows the three gate oxide thicknesses 77, 85, and 96 A. In this alternative of increasing $V_{CH}$, the Lm drops drastically for gate oxide thickness equal to 77 A, and the 85 A thickness yields Lm over 0.08 for all three substrate biases. In fact, the VTdose at Lm maximum and Vbb=0 increases from 4.0×10$^{12}$/cm$^2$ to 4.7×10$^{12}$/cm$^2$ as $V_{CH}$ increases from 0.8 to 0.85 Vcc.

Gate Length Target 0.25 μm

Figure 5A:
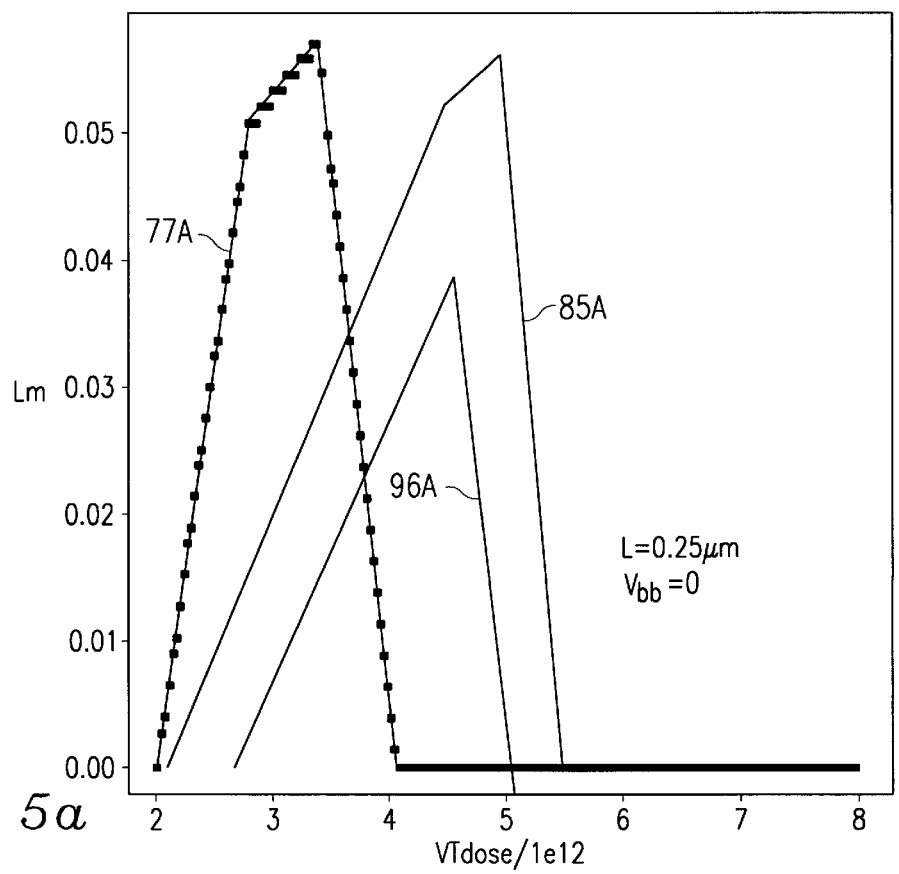
FIGS. 5a–c show a third preferred embodiment design.
Figure 5B:
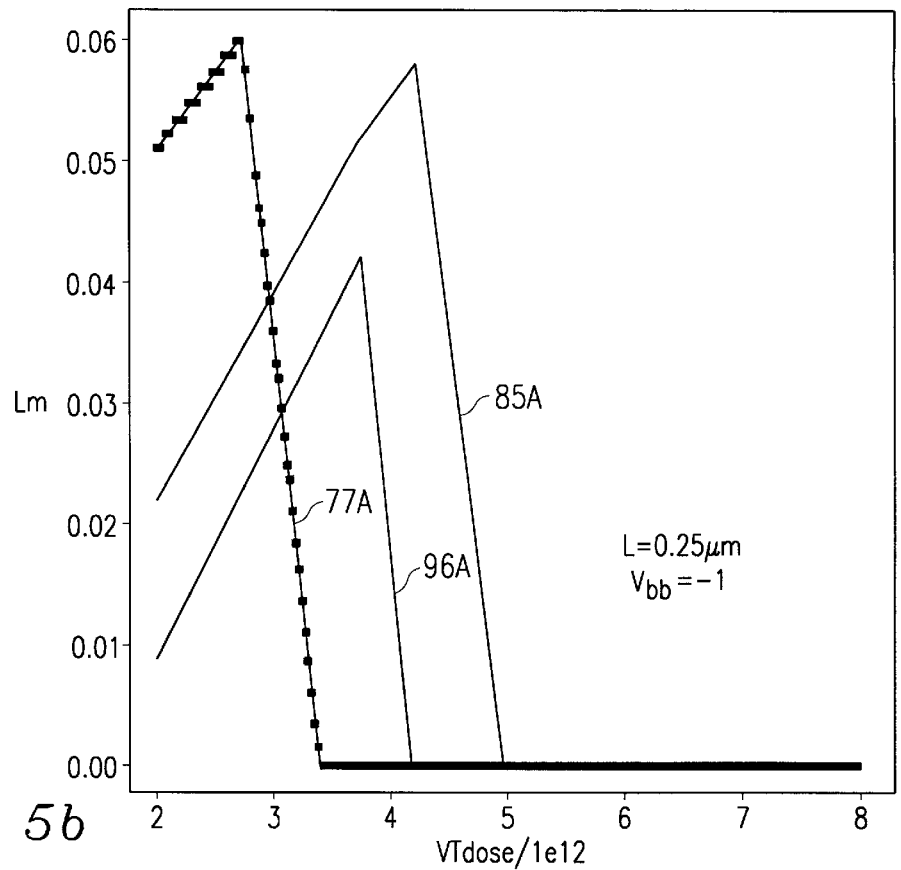
Figure 5C:
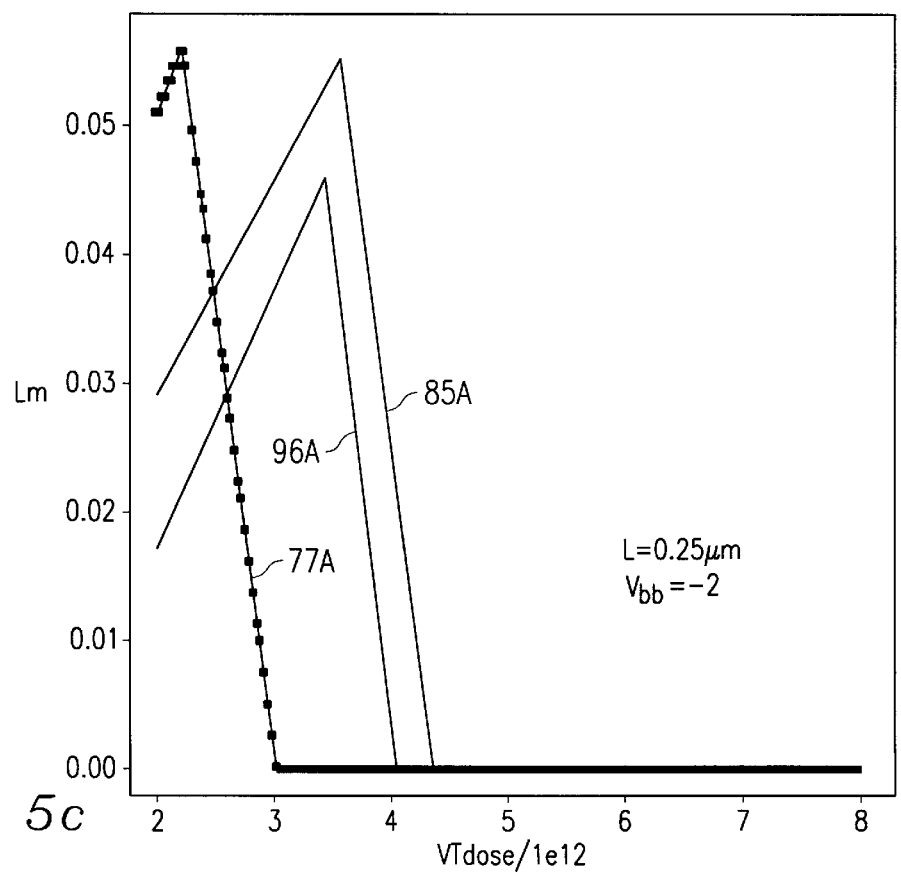

The second preferred embodiment pass transistors have a target gate length of 0.25 μm. The acceptability region for $I_{OFF}$ of less than 0.3 pA/μm and $V_{CH}$ of at least 0.8 $V_{DD}$ yields the Lm and VTdose relation shown in FIGS. 5a–c for substrate biases of 0, −1, and −2 volts, respectively. As previously, each Figure shows the Lm-VTdose relation for three gate oxide thickenesses: 77, 85, and 96 A. Again, because VTdose can be fairly accurately controlled, the variability of the lithographically defined gate length dominates the variability and thus the maximum Lm defines the pass transistor design parameters. FIGS. 5a–c imply designs of a target gate length 77 or 85 A with the maximum Lm almost 0.06 μm for each of the substrate biases with a gate thickness of 77 A and Vbb of −1 slightly the best. Again, the VTdose (×10$^{12}$/cm$^2$) is a function of Vbb:

| Vbb | 77 A | 85 A |
|---|---|---|
| 0 | 3.4 | 5.1 |
| −1 | 2.7 | 4.1 |
| −2 | 2.3 | 3.5 |

Thus a square root of Vbb approximation could again be used:

$$VTdose = -0.37 + (T_{ox} - 59)(0.21 - 0.04\sqrt{-Vbb})$$

The multiplicative factors in the approximation are close to those of the L=0.3 μm case, but the additive constant varies significantly, as expected.

Modifications

The preferred embodiments may be varied in many ways while retaining one or more of the features of the VTdose dependent on the square root of −Vbb as the gate length and gate oxide thickness are varied. For example, different power supply voltages, Vcc, such as 1.8 volts, 1.5 volts; different maximum electric field in the gate oxide, such as 3.0–3.5 MV/cm less than the experimental limits; different gate oxide thicknesses, and so forth.

What is claimed is:

1. A dynamic memory integrated circuit, comprising:
   (a) an array of n-channel MOSFET pass transistors and corresponding storage nodes, each of said pass transistors has a gate length of about 0.3 μm and a threshold adjustment dopant dose (VTdose) approximately related to gate oxide thickness ($T_{ox}$) and operating substrate bias (Vbb) by $$VTdose = -1.0 + (T_{ox} - 59)(0.225 - 0.04\sqrt{-Vbb})$$

with VTdose in units of 10$^{12}$ dopants/cm$^2$, $T_{ox}$ in units of Angstroms, and Vbb in units of volts; and
   (b) peripheral circuitry.

2. A dynamic memory integrated circuit, comprising:
   (a) an array of n-channel MOSFET pass transistors and corresponding storage nodes, each of said pass transistors has a gate length of about 0.25 μm and a threshold adjustment dopant dose (VTdose) approximately related to gate oxide thickness ($T_{ox}$) and operating substrate bias (Vbb) by $$VTdose = -0.37 + (T_{ox} - 59)(0.21 - 0.04\sqrt{-Vbb})$$

with VTdose in units of 10$^{12}$ dopants/cm$^2$, $T_{ox}$ in units of Angstroms, and Vbb in units of volts; and
   (b) peripheral circuitry.

* * * * *